US011856855B2

(12) United States Patent
Chiu et al.

(10) Patent No.: US 11,856,855 B2
(45) Date of Patent: Dec. 26, 2023

(54) THERMAL SENSOR AND MANUFACTURING METHOD THEREOF

(71) Applicant: Nuvoton Technology Corporation, Hsinchu (TW)

(72) Inventors: In-Shiang Chiu, Hsinchu (TW); Kuang-Chu Chen, Hsinchu (TW); Peng-Chan Hsiao, Hsinchu (TW); Han-Ying Liu, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 563 days.

(21) Appl. No.: 16/997,953

(22) Filed: Aug. 20, 2020

(65) Prior Publication Data

US 2021/0190601 A1 Jun. 24, 2021

(30) Foreign Application Priority Data

Dec. 24, 2019 (TW) .................................. 108147398

(51) Int. Cl.
*H10N 10/01* (2023.01)
*H10N 10/17* (2023.01)

(52) U.S. Cl.
CPC ............. *H10N 10/01* (2023.02); *H10N 10/17* (2023.02)

(58) Field of Classification Search
CPC .................. H10N 10/01; H10N 10/17
See application file for complete search history.

(56) References Cited

U.S. PATENT DOCUMENTS

| 2008/0216883 | A1 | 9/2008 | Leneke et al. |
| 2010/0012841 | A1* | 1/2010 | Rafferty ............ H01L 27/14649 250/332 |
| 2010/0270620 | A1 | 10/2010 | Dibra et al. |
| 2014/0015089 | A1 | 1/2014 | Savelli et al. |
| 2014/0246749 | A1* | 9/2014 | Nam ......................... G01J 5/12 257/467 |
| 2016/0079306 | A1* | 3/2016 | Kropelnicki .......... G01J 5/0853 438/54 |

(Continued)

FOREIGN PATENT DOCUMENTS

| TW | 200532907 | 10/2005 |
| TW | 200540957 | 12/2005 |

(Continued)

OTHER PUBLICATIONS

"Office Action of Taiwan Counterpart Application", dated Feb. 2, 2021, p. 1-p. 5.

*Primary Examiner* — Yara B Green
*Assistant Examiner* — Fakeha Sehar
(74) *Attorney, Agent, or Firm* — JCIPRNET

(57) ABSTRACT

Provided are a thermal sensor and a manufacturing method thereof. The thermal sensor includes a transistor and a thermal sensing device. The thermal sensing device is disposed in a recess in a substrate and electrically connected to the transistor. The thermal sensing device includes a first dielectric layer, a metal silicide reflective layer, a second dielectric layer, and a thermal absorbing layer. The first dielectric layer is disposed on sidewalls and a bottom of the recess. The metal silicide reflective layer is disposed on the first dielectric layer located on the bottom of the recess. The second dielectric layer is disposed at a top of the recess. The thermal absorbing layer is disposed on the second dielectric layer.

6 Claims, 4 Drawing Sheets

(56) References Cited

U.S. PATENT DOCUMENTS

2018/0166482 A1   6/2018  Park
2019/0019838 A1*  1/2019  Kropelnicki ...... H01L 27/14612

FOREIGN PATENT DOCUMENTS

| TW | 200721558 | 6/2007 |
| TW | 200746233 | 12/2007 |
| TW | 201539668 | 10/2015 |
| TW | 201834187 | 9/2018 |

* cited by examiner

THERMAL SENSOR AND MANUFACTURING METHOD THEREOF

CROSS-REFERENCE TO RELATED APPLICATION

This application claims the priority benefit of Taiwan application serial no. 108147398, filed on Dec. 24, 2019. The entirety of the above-mentioned patent application is hereby incorporated by reference herein and made a part of this specification.

BACKGROUND OF THE INVENTION

Field of the Invention

The invention relates to a thermal sensor and a manufacturing method thereof.

Description of Related Art

Generally, a common thermal sensor is formed by a transistor and a thermal sensing device electrically connected to the transistor. The thermal sensing device generally includes a thermal absorbing layer and a thermal reflective layer disposed underneath. After the thermal absorbing layer absorbs heat, a signal may be transmitted to the transistor electrically connected thereto. For the heat that passes through the thermal absorbing layer without being absorbed, the thermal reflective layer may reflect the heat back to the thermal absorbing layer to achieve the object of maximum thermal absorbing efficiency.

In the current manufacturing process, usually after a structure such as a transistor or an interconnect is formed, the thermal sensing device is formed above the structure. In this way, the overall structure has a considerable thickness, which is not conducive to the thinning trend in the industry. In addition, for the material selection of the thermal absorbing layer, it is preferable to select a doped semiconductor material having a higher seebeck coefficient. However, when implanting a dopant into a semiconductor material, a high-temperature heat treatment may be required to diffuse the dopant, thereby causing damage to a previously formed metal member (such as a wire, a connecting element, a metal heat-reflective layer, etc.) In addition, in the case in which a doped region is used as the thermal reflective layer of the thermal sensing device, the issue of poor reflection efficiency due to excessive diffusion of a dopant in the doped region from the high-temperature heat treatment also occurs.

SUMMARY OF THE INVENTION

The invention provides a thermal sensor having a metal silicide reflective layer.

The invention provides a manufacturing method of a thermal sensor used for manufacturing the thermal sensor.

The thermal sensor of the invention includes a transistor and a thermal sensing device. The thermal sensing device is disposed in a recess in a substrate and electrically connected to the transistor. The thermal sensing device includes a first dielectric layer, a metal silicide reflective layer, a second dielectric layer, and a thermal absorbing layer. The first dielectric layer is disposed on sidewalls and a bottom of the recess. The metal silicide reflective layer is disposed on the first dielectric layer located on the bottom of the recess. The second dielectric layer is disposed at a top of the recess. The thermal absorbing layer is disposed on the second dielectric layer.

In an embodiment of the thermal sensor of the invention, the transistor is horizontally adjacent to the thermal sensing device.

In an embodiment of the thermal sensor of the invention, a material of the metal silicide reflective layer is, for example, tungsten silicide, titanium silicide, aluminum silicide, nickel silicide, or a combination thereof.

In an embodiment of the thermal sensor of the invention, the metal silicide reflective layer is further disposed on the first dielectric layer located on the sidewalls of the recess.

In an embodiment of the thermal sensor of the invention, the thermal absorbing layer is, for example, a P-type silicon-doped layer, an N-type silicon-doped layer, or a combination thereof.

In an embodiment of the thermal sensor of the invention, the P-type silicon-doped layer and the N-type silicon-doped layer are, for example, disposed on the second dielectric layer and adjacent to each other.

The manufacturing method of a thermal sensor of the invention includes the following steps. A recess is formed in a substrate. A first dielectric layer is formed on sidewalls and a bottom of the recess. A metal silicide reflective layer is formed on the first dielectric layer located on the bottom of the recess. A second dielectric layer is formed at a top of the recess. A thermal absorbing layer is formed on the second dielectric layer. A transistor is formed on the substrate, wherein the transistor is electrically connected to the thermal absorbing layer.

In an embodiment of the manufacturing method of the thermal sensor of the invention, a material of the metal silicide reflective layer is, for example, tungsten silicide, titanium silicide, aluminum silicide, nickel silicide, or a combination thereof.

In an embodiment of the manufacturing method of the thermal sensor of the invention, the metal silicide reflective layer is further formed on the first dielectric layer located on the sidewalls of the recess.

In an embodiment of the manufacturing method of the thermal sensor of the invention, the thermal absorbing layer is, for example, a P-type silicon-doped layer, an N-type silicon-doped layer, or a combination thereof.

In an embodiment of the manufacturing method of the thermal sensor of the invention, the P-type silicon-doped layer and the N-type silicon-doped layer are, for example, disposed on the second dielectric layer and adjacent to each other.

In an embodiment of the manufacturing method of the thermal sensor of the invention, a method of forming the second dielectric layer at the top of the recess includes the following steps. A sacrificial layer is filled in the recess after the metal silicide reflective layer is formed. The second dielectric layer is formed on the sacrificial layer. The sacrificial layer is removed.

Based on the above, in the invention, before the transistor and other metal members are formed, the thermal sensing device is formed in the recess in the substrate, so that the transistor and other metal members may be prevented from being subjected to the influence from the high-temperature heat treatment during the manufacture of the thermal sensing device. In addition, in the thermal sensing device, a metal silicide reflective layer is used as the thermal reflective layer having a thermal reflectivity similar to that of a metal reflective layer, and is not readily damaged in the subsequent high-temperature heat treatment.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
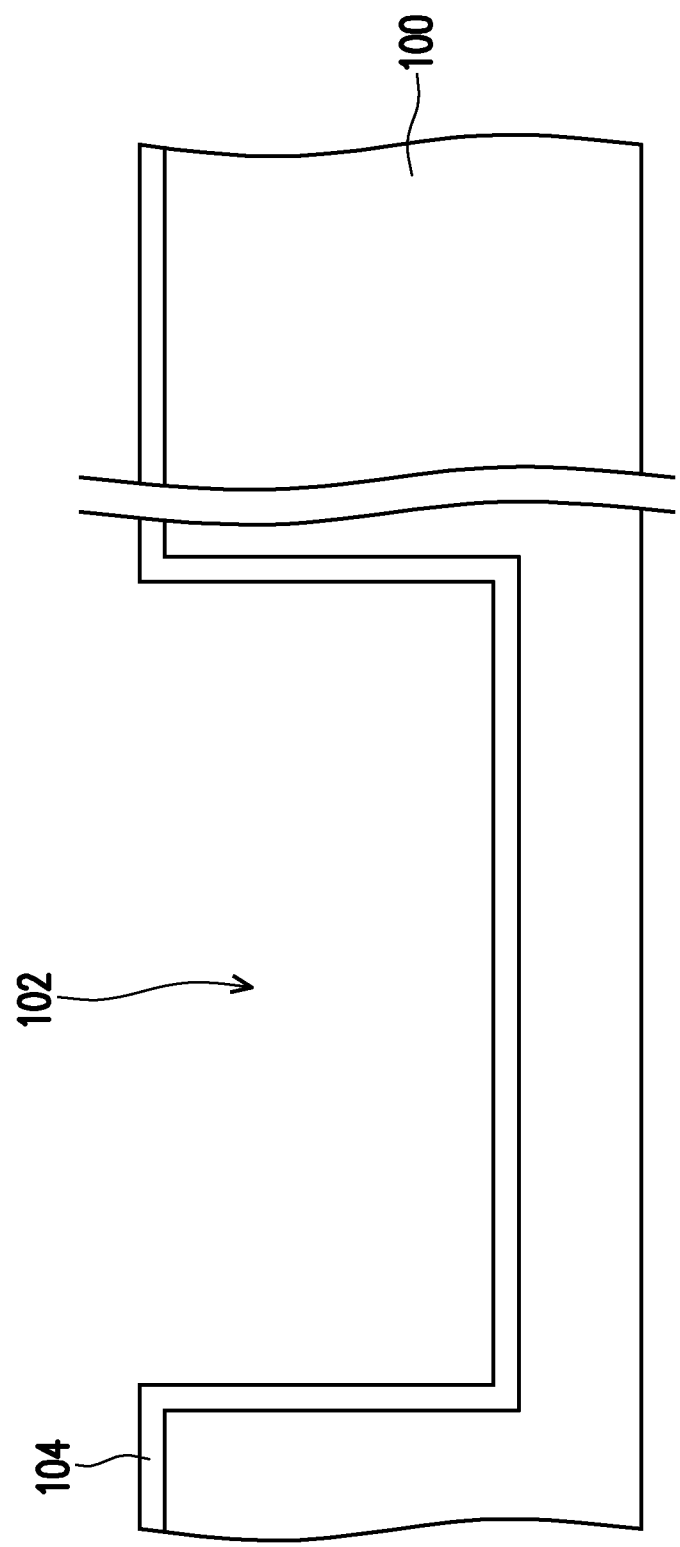
FIG. 1A to FIG. 1C are cross-sectional views of a manufacturing process of a thermal sensor shown according to an embodiment of the invention.
Figure 1B:
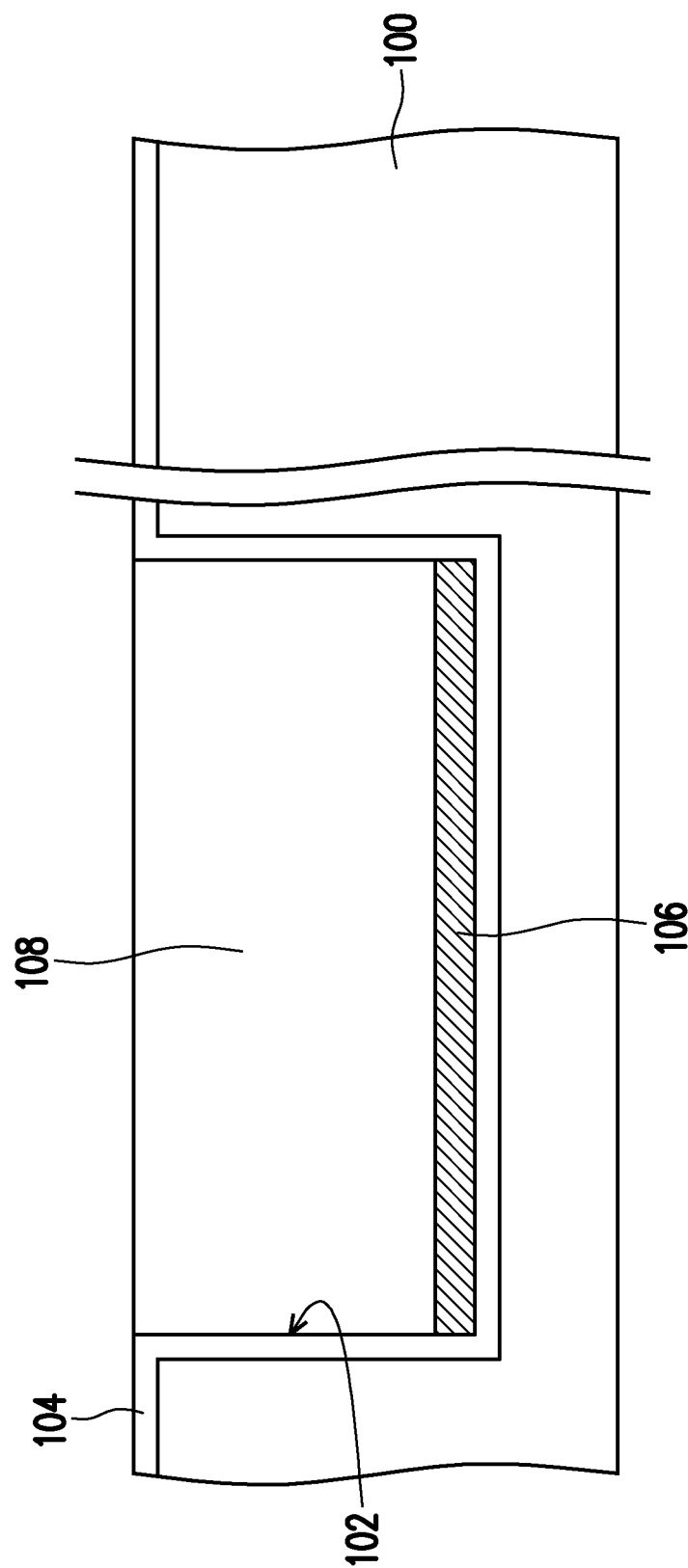
Figure 1C:
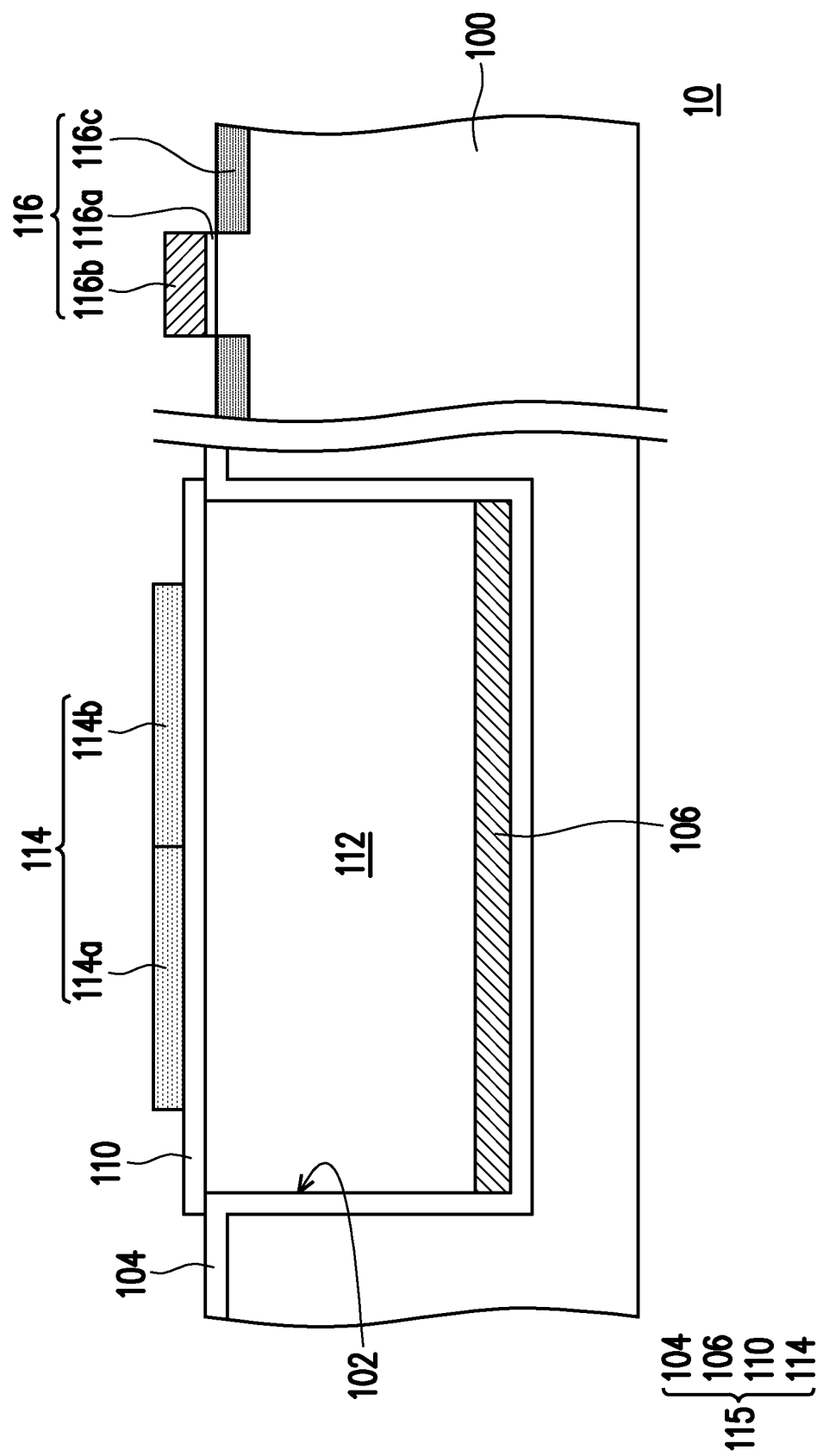

FIG. 1A to FIG. 1C are cross-sectional views of a manufacturing process of a thermal sensor shown according to an embodiment of the invention. First, referring to FIG. 1A, a substrate 100 is provided. The substrate 100 is a semiconductor substrate such as a silicon substrate. Next, a recess 102 is formed in the substrate 100. A forming method of the recess 102 includes, for example, performing a patterning process. In the present embodiment, the size of the recess 102 is not limited as long as the recess 102 does not penetrate the substrate 100. The width and depth of the recess 102 depend on the functional requirements of the thermal sensing device to be formed. Then, a first dielectric layer 104 is formed on the sidewalls and the bottom of the recess 102. In the present embodiment, the first dielectric layer 104 is, for example, an oxide layer. A forming method of the first dielectric layer 104 includes, for example, performing a chemical vapor deposition process or a thermal oxidation process.

Then, referring to FIG. 1B, a metal silicide reflective layer 106 is formed on the first dielectric layer 104 located on the bottom of the recess 102. The material of the metal silicide reflective layer 106 is, for example, tungsten silicide, titanium silicide, aluminum silicide, nickel silicide, or a combination thereof. The forming method of the metal silicide reflective layer 106 includes, for example, performing a chemical vapor deposition process to form a metal silicide material layer on the first dielectric layer 104, and then performing a patterning process to remove the metal silicide material layer on the sidewalls of the recess 102 and outside the recess 102. The thickness of the metal silicide reflective layer 106 may be designed according to requirements, and the invention is not limited in this regard. In the present embodiment, the metal silicide reflective layer 106 is located on the entire bottom of the recess 102, but the invention is not limited thereto. In other embodiments, depending on the functional requirements of the thermal sensing device to be formed, the metal silicide reflective layer 106 may be located only on a portion of the bottom of the recess 102. In addition, in the present embodiment, the metal silicide reflective layer 106 is a single-layer structure, but the invention is not limited thereto. In other embodiments, depending on the functional requirements of the thermal sensing device to be formed, the metal silicide reflective layer 106 may be a multilayer structure.

Then, a sacrificial layer 108 is filled in the recess 102. The material of the sacrificial layer 108 is, for example, titanium silicide, aluminum silicide, nickel silicide, or a combination thereof, but the invention is not limited thereto. In the present embodiment, the sacrificial layer 108 completely fills the recess 102, but the invention is not limited thereto. In other embodiments, the sacrificial layer 108 may not completely fill the recess 102, or the top surface of the sacrificial layer 108 may be slightly higher than the top of the recess 102 (i.e., slightly higher than the top surface of the first dielectric layer 104 on the surface of the substrate 100 outside the recess 102).

Then, referring to FIG. 1C, a second dielectric layer 110 is formed on the sacrificial layer 108 (refer to FIG. 1B). In the present embodiment, the second dielectric layer 110 is, for example, an oxide layer. The forming method of the second dielectric layer 110 includes, for example, performing a chemical vapor deposition process to form a dielectric material layer on the sacrificial layer 108 and on the first dielectric layer 104 outside the recess 102, and then performing a patterning process to remove at least a portion of the dielectric material layer on the first dielectric layer 104 outside the recess 102. In this way, the second dielectric layer 110 is located at least above the entire recess 102 and may be extended onto the first dielectric layer 104 outside the recess 102 according to actual requirements.

Next, a thermal absorbing layer 114 is formed on the second dielectric layer 110. In the present embodiment, the thermal absorbing layer 114 includes a P-type silicon-doped layer 114a and an N-type silicon-doped layer 114b respectively located on the second dielectric layer 110 and adjacent to each other, but the invention is not limited thereto. In other embodiments, the thermal absorbing layer 114 may be the P-type silicon-doped layer 114a, the N-type silicon-doped layer 114b, or other suitable thermal absorbing material layers. In particular, when the thermal absorbing layer 114 is the P-type silicon-doped layer 114a, the N-type silicon-doped layer 114b, or a combination thereof, during the process of forming the thermal absorbing layer 114, a high-temperature heat treatment is needed to diffuse a dopant after the dopant is implanted. Since the metal silicide reflective layer 106 may withstand a higher temperature, the metal silicide reflective layer 106 is not damaged. In other words, since the metal silicide reflective layer 106 is not readily damaged by the high-temperature heat treatment, the P-type silicon-doped layer 114a and/or the N-type silicon-doped layer 114b having a higher seebeck coefficient may be used as the thermal absorbing layer 114, so that the thermal sensor of the present embodiment has better performance.

Then, the sacrificial layer 108 is removed. The method of removing the sacrificial layer 108 is known to those skilled in the art, and is not repeated herein. After the sacrificial layer 108 is removed, the first dielectric layer 104 located on the sidewalls and the bottom of the recess 102 and at the second dielectric layer 110 located at the top of the recess 102 form a cavity 112. The object of the cavity 112 is to prevent the heat penetrating the thermal absorbing layer 114 from being dissipated due to contact thermal conduction, and the cavity 112 may be designed to match the wavelength to be reflected to achieve the effect of increasing reflection efficiency. In this way, a thermal sensing device 115 of the present embodiment is formed.

Next, the first dielectric layer 104 outside the recess 102 is removed to expose the surface of the substrate 100. Then, a transistor 116 electrically connected to the thermal sensing device 115 is formed on the substrate 100 to form a thermal sensor 10 of the present embodiment. In the present embodiment, the transistor 116 includes a gate dielectric layer 116a and a gate 116b sequentially disposed on the substrate 100 and a source/drain region 116c located in the substrate 100 on two sides of the gate 116b. The forming method of the transistor 116 is known to those skilled in the art and is not repeated herein. In the present embodiment, the transistor 116 may be horizontally adjacent to the thermal sensing device 115, but the invention is not limited thereto.

In the present embodiment, since the transistor 116 is formed only after the thermal sensing device 115 is formed, the transistor 116 and other metal members formed subsequently are not damaged by the influence from the high-temperature heat treatment when the thermal absorbing layer 114 is formed. In other words, since the transistor 116 and other metal members formed subsequently are not damaged by the influence from the high-temperature heat treatment, the P-type silicon-doped layer 114a and/or the N-type silicon-doped layer 114b having a higher seebeck coefficient may be used as the thermal absorbing layer 114, so that the thermal sensor of the present embodiment has better performance.

In addition, in the present embodiment, the material of the metal silicide reflective layer 106 may be matched with the transistor 116 subsequently formed and other members subsequently formed, so the issue of mutual contamination between a front-end process and a rear-end process does not occur. For example, if a metal reflective layer is used, when the metal silicide layer in the transistor is subsequently formed, the metal silicide may be formed at the metal reflective layer. Alternatively, the metal forming the metal reflective layer may be formed in other regions and affect the subsequently formed elements.

The thermal sensor 10 in FIG. 1C is taken as an example to describe the thermal sensor of the invention.

Referring to FIG. 1C, the thermal sensor 10 includes a thermal sensing device 115 and a transistor 116. The thermal sensing device 115 is disposed in the recess 102 in the substrate 100 and is electrically connected to the transistor 116. The thermal sensing device 115 includes the first dielectric layer 104, the metal silicide reflective layer 106, the second dielectric layer 110, and the thermal absorbing layer 114. The first dielectric layer 104 is disposed on the sidewalls and the bottom of the recess 102. The metal silicide reflective layer 106 is disposed on the first dielectric layer 104 located on the bottom of the recess 102. The second dielectric layer 110 is disposed at the top of the recess 102 and forms the cavity 112 with the first dielectric layer 104. The thermal absorbing layer 114 is disposed on the second dielectric layer 110 and includes the P-type silicon-doped layer 114a and the N-type silicon-doped layer 114b adjacent to each other.

When heat from the outside reaches the thermal absorbing layer 114, the thermal absorbing layer 114 absorbs the heat and may transmit a signal to the transistor 116 electrically connected thereto. Unabsorbed heat passes through the thermal absorbing layer 114 and enters the cavity 112. At this time, the metal silicide reflective layer 106 may reflect the heat entering the cavity 112 to the thermal absorbing layer 114 to be absorbed. In this way, the effect of maximum thermal absorption may be achieved. In the present embodiment, since the thermal reflective layer is the metal silicide reflective layer 106 having a reflectivity similar to that of a metal, maximum thermal absorption may be facilitated.

In the above embodiments, the metal silicide reflective layer 106 is located at the bottom of the recess 102, but the invention is not limited thereto. In other embodiments, the metal silicide reflective layer 106 may further be located on the sidewalls of the recess 102, which will be described below.

Figure 2:
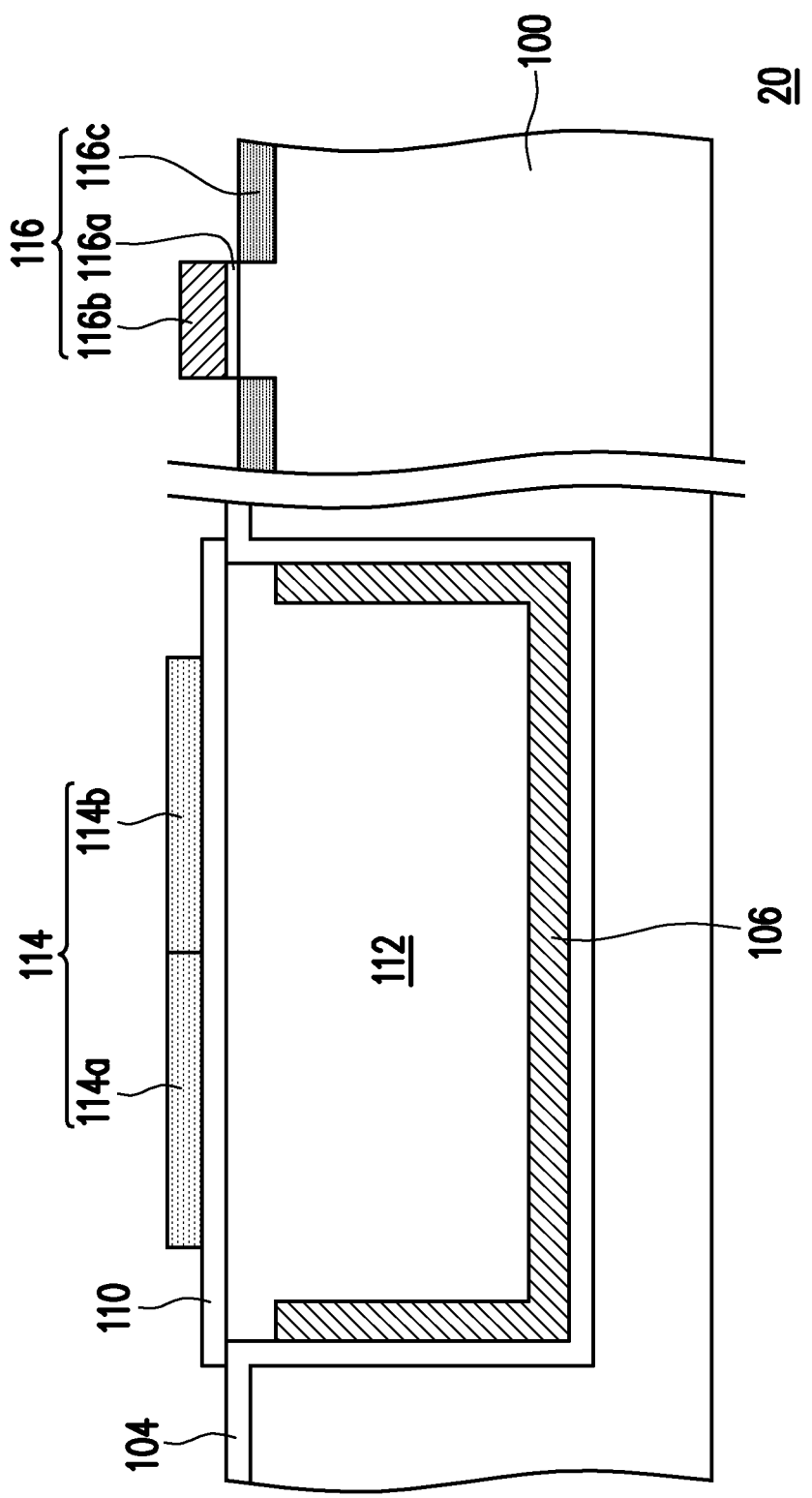
FIG. 2 is a cross-sectional view of a thermal sensor shown according to another embodiment of the invention.

FIG. 2 is a cross-sectional view of a thermal sensor shown according to another embodiment of the invention. Please refer to FIG. 2. In the present embodiment, the difference between a thermal sensor 20 and the thermal sensor 10 is that the metal silicide reflective layer 106 is not only located at the bottom of the recess 102 but also extended upward to be disposed on the sidewalls of the recess 102. In this way, the heat passing through the thermal absorbing layer 114 may be more effectively reflected to the thermal absorbing layer 114 to achieve the effect of maximum thermal absorption.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A thermal sensor, comprising:
a transistor disposed on a substrate; and
a thermal sensing device disposed in a recess in the substrate and electrically connected to the transistor,
wherein the thermal sensing device comprises:
 a first dielectric layer disposed on sidewalls and a bottom of the recess;
 a metal silicide reflective layer disposed on the first dielectric layer located on the bottom of the recess;
 a second dielectric layer disposed at a top of the recess; and
 a thermal absorbing layer disposed on the second dielectric layer,
wherein the thermal absorbing layer comprises a P-type silicon-doped layer and an N-type silicon-doped layer disposed on the second dielectric layer and connected with each other, and
wherein the metal silicide reflective layer comprises a multilayer structure.

2. The thermal sensor of claim 1, wherein the transistor is horizontally adjacent to the thermal sensing device.

3. The thermal sensor of claim 1, wherein the metal silicide reflective layer is further disposed on the first dielectric layer located on the sidewalls of the recess.

4. The thermal sensor of claim 1, wherein the metal silicide reflective layer is disposed on an entire bottom of the recess.

5. The thermal sensor of claim 1, wherein the metal silicide reflective layer is disposed on a portion of the bottom of the recess.

6. The thermal sensor of claim 1, wherein the second dielectric layer is extended outside the recess.

* * * * *